US 8,187,938 B2

(12) United States Patent
Lim et al.

(10) Patent No.: US 8,187,938 B2
(45) Date of Patent: May 29, 2012

(54) NON-VOLATILE MEMORY DEVICE AND METHOD FOR FABRICATING THE SAME

(75) Inventors: Se-Yun Lim, Gyeonggi-do (KR);
Eun-Seok Choi, Gyeonggi-do (KR);
Young-Wook Lee, Gyeonggi-do (KR);
Won-Joon Choi, Gyeonggi-do (KR);
Ki-Hong Lee, Gyeonggi-do (KR);
Sang-Bum Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/754,395

(22) Filed: Apr. 5, 2010

(65) Prior Publication Data
US 2010/0258852 A1 Oct. 14, 2010

(30) Foreign Application Priority Data

Apr. 13, 2009 (KR) .................. 10-2009-0031897
Jun. 26, 2009 (KR) .................. 10-2009-0057622
Feb. 2, 2010 (KR) .................. 10-2010-0009548

(51) Int. Cl.
*H01L 21/336* (2006.01)
(52) U.S. Cl. ............ 438/269; 257/E21.41; 257/E21.423
(58) Field of Classification Search .................. 438/269; 257/E21.41, E21.423
See application file for complete search history.

(56) References Cited

U.S. PATENT DOCUMENTS

| | | | | |
|---|---|---|---|---|
| 5,843,819 A | * | 12/1998 | Kellner et al. | ............... 438/243 |
| 7,268,381 B2 | * | 9/2007 | Birner et al. | ................... 257/301 |
| 2009/0242966 A1 | * | 10/2009 | Son et al. | ..................... 257/324 |
| 2010/0019310 A1 | * | 1/2010 | Sakamoto | .................... 257/324 |

FOREIGN PATENT DOCUMENTS

| JP | 2007-266143 | 10/2007 |
|---|---|---|
| KR | 1020070017554 | 2/2007 |

OTHER PUBLICATIONS

Notice of Preliminary Rejection issued from Korean Intellectual Property Office on Mar. 4, 2011.
H. Tanaka, et al., "Bit Cost Scalable Tech. with Punch and Plug Process for Ultra High Density Flash Memory", 2007 Symposium on VLSI Tech. Digest of Technical Papers, pp. 14-15.
Notice of Allowance issued by the Korean Intellectual Property Office on Dec. 28, 2011.

* cited by examiner

*Primary Examiner* — Alexander Ghyka
*Assistant Examiner* — Stanetta Isaac
(74) *Attorney, Agent, or Firm* — IP & T Group LLP

(57) ABSTRACT

A method for fabricating a non-volatile memory device includes alternately stacking a plurality of interlayer dielectric layers and a plurality of conductive layers over a substrate, etching the interlayer dielectric layers and the conductive layers to form a trench which exposes a surface of the substrate forming a first material layer over a resulting structure in which the trench is formed, forming a second material layer over the first material layer, removing portions of the second material layer and the first material layer formed on a bottom of the trench to expose the surface of the substrate, removing the second material layer, and burying a channel layer within the trench in which the second material layer is removed.

19 Claims, 12 Drawing Sheets

NON-VOLATILE MEMORY DEVICE AND METHOD FOR FABRICATING THE SAME

CROSS-REFERENCES TO RELATED APPLICATIONS

The present application claims priority of Korean Patent Application Nos. 10-2009-0031897, 10-2009-0057622, and 10-2010-0009548, filed on Apr. 13, 2009, Jun. 26, 2009, and Feb. 2, 2010, respectively, which are incorporated herein by reference in their entirety.

BACKGROUND OF THE INVENTION

Exemplary embodiments of the present invention relate to a method for fabricating a non-volatile memory device, and more particularly, to a non-volatile memory device having a three-dimensional structure and a vertical channel structure.

A non-volatile memory device retains data even when power is interrupted. As improving the integration density of a memory device having a two-dimensional structure in which memory cells are arranged on a silicon substrate in a single layer becomes more difficult, a non-volatile memory device having a three-dimensional structure in which memory cells are vertically stacked on a silicon substrate has been proposed.

A method for fabricating a conventional non-volatile memory device having a three-dimensional structure will be described below in detail with reference to FIGS. 1A to 1C.

FIGS. 1A to 1C are cross-sectional views illustrating a method for fabricating a conventional non-volatile memory device having a three-dimensional structure. Specifically, FIGS. 1A to 1C illustrate a method for fabricating a non-volatile memory device having a three-dimensional structure in which a cell string is vertically arranged on a substrate. For convenience, FIGS. 1A to 1C focus on a process of forming a plurality of memory cells, and a lower select transistor and an upper select transistor are not illustrated.

Referring to FIG. 1A, a plurality of interlayer dielectric layers 11 and a plurality of conductive layers 12 for gate electrodes are alternately formed on a substrate 10 in which a required lower structure, such as a source line and a lower select transistor, is formed. The interlayer dielectric layers 11 and the conductive layers 12 for gate electrodes are selectively etched to form a trench which exposes the surface of the substrate 10. A first material layer 13 in which a charge blocking layer, a charge trap layer, and a tunnel insulation layer are sequentially stacked is formed over the resulting structure in which the trench is formed.

The charge blocking layer serves to block electric charges from passing through the charge trap layer and moving in a direction of a gate electrode. The charge trap layer is used as an actual data storage layer, and traps electric charges into deep-level trap sites or a charge storage layer which stores electric charges within a conduction band according to a data storing scheme. The tunnel insulation layer is provided as an energy barrier layer according to a tunneling of electric charges.

Referring to FIG. 1B, a portion of the first material layer 13 formed on the bottom of the trench is removed to expose the surface of the substrate 10.

In FIG. 1B, reference numeral "13A" represents the first material layer remaining on the inner walls of the trench, where the trench is created for the purpose of subsequently forming a channel.

The removing of the first material layer 13 formed on the bottom of the trench is performed by an etch-back process. However, the first material layer 13A formed on the inner walls of the trench is damaged during the etch-back process (see ① of FIG. 1B). Specifically, the tunnel insulation layer, which is the most influential to the characteristics of the non-volatile memory device, may be damaged. Thus, the data retention characteristic and the cycling characteristic are degraded, causing a reduction in the reliability of the non-volatile memory device.

Referring to FIG. 1C, the trench is filled with a channel layer in order to form a channel 14 protruding vertically from the substrate 10. In this way, a plurality of memory cells stacked along the channel 14 protruding vertically from the substrate 10 are formed.

In this case, since the trench is filled with the layer for a channel in such a state the first material layer 13A is formed along the inner wall of the trench for a channel, the width of the trench for a channel is narrowed and thus void is generated when the trench is filled with the layer for a channel. In addition, since the first material layer 13A and the plurality of memory cells stacked along the channel 14 are integrally connected, the data retention characteristic and the cycling characteristic are further degraded, as a result of filling the void with a channel layer.

During the process of removing a portion of the first material layer 13 formed on the bottom of the trench, the first material layer 13A formed on the inner walls of the trench is damaged, and thus, the data retention characteristic and the cycling characteristic are degraded.

In particular, such concerns may also arise during the process of forming the lower select transistor and the upper select transistor, as well as the process of forming the memory cells.

The lower select transistor and the upper select transistor are formed through the same process as the process of forming the memory cells, however, a gate dielectric layer is formed instead of the first material layer 13. Therefore, the gate dielectric layer formed on the inner walls of the trench may be damaged during the process of removing a portion of the gate dielectric layer formed on the bottom of the trench. Consequently, a threshold voltage of a transistor may be changed and a leakage current may be generated in an off state of the transistor. In particular, when a leakage current is generated, a boosting level in a program inhibited cell string may be lowered and an error may occur during a program operation.

SUMMARY OF THE INVENTION

An embodiment of the present invention is directed to a method for fabricating a non-volatile memory device, which is capable of preventing damage to a charge blocking layer, a charge trap layer, and a tunnel insulation layer in a memory cell.

Another embodiment of the present invention is directed to a method for fabricating a non-volatile memory device, which is capable of preventing damage to a gate dielectric layer of a select transistor.

Yet another embodiment of the present invention is directed to a non-volatile memory device and a method for fabricating the same, which are capable of preventing damage to a tunnel insulation layer during an etch-back process by forming a charge blocking layer, a charge trap layer or a charge storage layer, and a tunnel insulation layer after etching a gate electrode exposed by an inner wall of a trench for a channel by a predetermined thickness.

Still another embodiment of the present invention is directed to a non-volatile memory device and a method for fabricating the same, which are capable of preventing damage to a tunnel insulation layer during an etch-back process by forming a passivation layer over a charge blocking layer, a charge trap layer or a charge storage layer, and a tunnel insulation layer in order to prevent damage to those layers.

In accordance with an embodiment of the present invention, a method for fabricating a vertical channel type non-volatile memory device includes alternately stacking a plurality of interlayer dielectric layers and a plurality of conductive layers over a substrate, etching the interlayer dielectric layers and the conductive layers to form a trench which exposes a surface of the substrate, forming a first material layer over a resulting structure in which the trench is formed, forming a second material layer over the first material layer, removing portions of the second material layer and the first material layer formed on a bottom of the trench to expose the surface of the substrate, removing the second material layer, and burying a channel layer within the trench in which the second material layer is removed.

The first material layer may include a charge blocking layer, a charge trap layer or a charge storage layer, and a tunnel insulation layer.

The first material layer may serve as a gate dielectric layer of a select transistor.

The second material layer may be formed of a material having a high etch selectivity with respect to the first material layer.

The second material layer may include a nitride layer or a carbon layer.

The second material layer may include a polysilicon layer.

The second material layer may have a thickness ranging from approximately 1 nm to approximately 100 nm.

In accordance with another embodiment of the present invention, a method for fabricating a vertical channel type non-volatile memory device includes alternately stacking a plurality of interlayer dielectric layers and a plurality of conductive layers over a substrate, etching the interlayer dielectric layers and the conductive layers to form a trench, etching the conductive layers exposed by inner walls of the trench by a predetermined thickness to form grooves, forming a charge blocking layer, a charge trap layer or a charge storage layer, and a tunnel insulation layer along an entire surface of the trench, including surfaces of the conductive layers exposed by the grooves, and removing portions of the tunnel insulation layer, the charge trap layer or the charge storage layer, and the charge blocking layer formed on a bottom of the trench.

The method may further include filling the trench with a channel material after the removing of the charge blocking layer, the charge trap layer or the charge storage layer, and the tunnel insulation layer.

The method may further include removing the tunnel insulation layer, the charge trap layer or the charge storage layer, and the charge blocking layer formed on the inner walls of the trench from surfaces of the interlayer dielectric layers, so that the tunnel insulation layer, the charge trap layer or the charge storage layer, and the charge blocking layer remain only within the grooves.

The etching of the conductive layers by a predetermined thickness to form grooves may include performing an oxidation process to oxidize the conductive layers exposed by the inner walls of the trench to form an oxide layer of a predetermined thickness; and removing the oxide layer.

The method may further include forming a passivation layer over the charge blocking layer, the charge trap layer or the charge storage layer, and the tunnel insulation layer formed along the inner walls of the trench.

The passivation layer may be formed of a material having a high etch selectivity with respect to the tunnel insulation layer.

The passivation layer may further include any one of a nitride layer, a carbon layer, and a polysilicon layer.

The method may further include removing the passivation layer after portions of the passivation layer, the tunnel insulation layer, the charge trap layer or the charge storage layer, and the charge blocking layer formed on the bottom of the trench are removed, when the passivation layer comprises the nitride layer or the carbon layer.

The method may further include performing a curing process on the passivation layer after the passivation layer, the tunnel insulation layer, the charge trap layer or the charge storage layer, and the charge blocking layer formed on the bottom of the trench are removed, when the passivation layer comprises the polysilicon layer.

In the removing of portions of the tunnel insulation layer, the charge trap layer or the charge storage layer, and the charge blocking layer formed on the bottom of the trench, the passivation layer may be removed together, and the passivation layer, the tunnel insulation layer, the charge trap layer or the charge storage layer, and the charge blocking layer formed on the bottom of the trench are etched and removed while leaving the passivation layer, the charge trap layer or the charge storage layer, the charge blocking layer, and the tunnel insulation layer within the grooves.

In accordance with yet another embodiment of the present invention, a method for fabricating a vertical channel type non-volatile memory device includes alternately stacking a plurality of interlayer dielectric layers and a plurality of conductive layers over a substrate, etching the interlayer dielectric layers and the conductive layers to form a trench, forming a charge blocking layer, a charge trap layer or a charge storage layer, and a tunnel insulation layer along an entire surface of the trench, forming a passivation layer over the charge blocking layer, the charge trap layer or the charge storage layer, and the tunnel insulation layer formed along the entire surface of the trench, and removing portions of the passivation layer, the tunnel insulation layer, the charge trap layer or the charge storage layer, and the charge blocking layer formed on a bottom of the trench.

The passivation layer may include polysilicon.

The method may further include performing a curing process on the passivation layer after the removing of portions of the passivation layer, the tunnel insulation layer, the charge trap layer or the charge storage layer, and the charge blocking layer formed on the bottom of the trench.

Still in accordance with another embodiment of the present invention, a non-volatile memory device includes an interlayer dielectric layer and a gate electrode alternately stacked over a substrate, a trench formed by partially etching the interlayer dielectric layer and the gate electrode to expose the substrate, a groove formed by partially removing the gate electrode exposed by inner walls of the trench, a channel formed within the trench and protruding from the substrate, and having protrusions at predetermined intervals, and a charge blocking layer, a charge trap layer or a charge storage layer, and a tunnel insulation layer formed along an entire surface of the channel having the protrusions.

The charge trap layer or the charge storage layer may be separated into a number of portions equivalent to a number of memory cells stacked along the channel.

The passivation layer may be formed over the tunnel insulation layer formed along the entire surface of the channel having the protrusions when the passivation layer includes the polysilicon layer.

The passivation layer may be formed of a material having a high etch selectivity with respect to the tunnel insulation layer.

The passivation layer may include any one of a nitride layer and a carbon.

DESCRIPTION OF SPECIFIC EMBODIMENTS

Figure 1A:
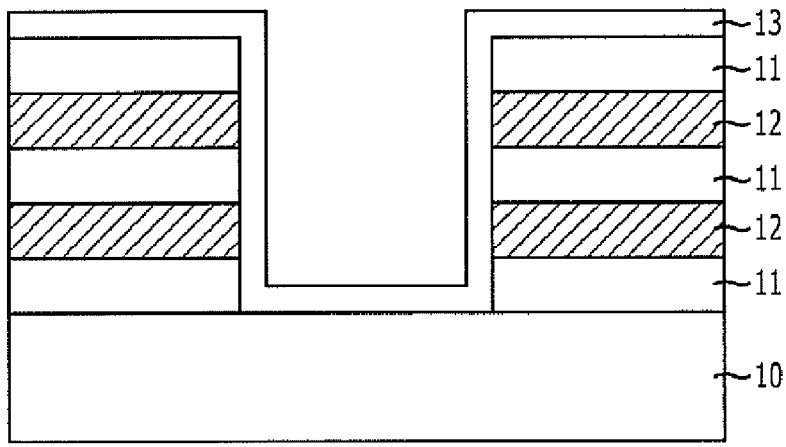
FIGS. 1A to 1C are cross-sectional views illustrating a method for fabricating a conventional non-volatile memory device having a three-dimensional structure.
Figure 1B:
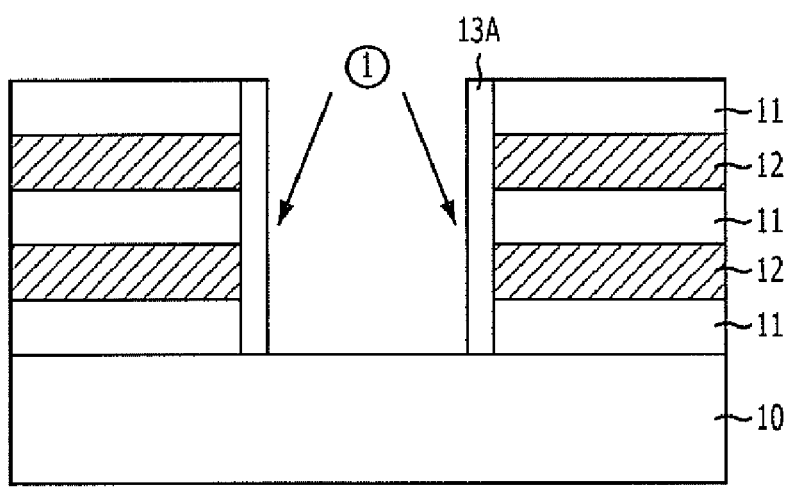
Figure 1C:
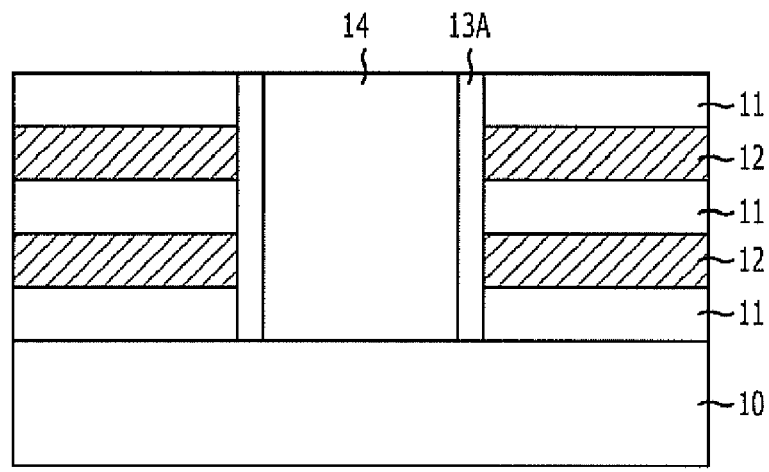

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 2A:
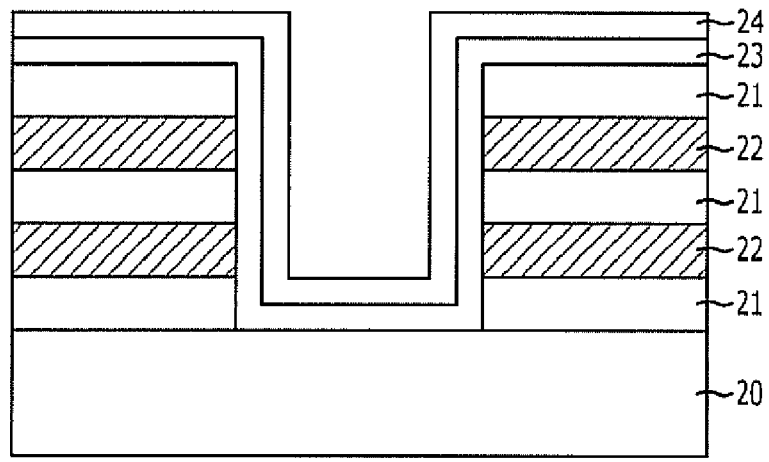
FIGS. 2A to 2C are cross-sectional views illustrating a method for fabricating a non-volatile memory device having a three-dimensional structure in accordance with a first embodiment of the present invention.
Figure 2B:
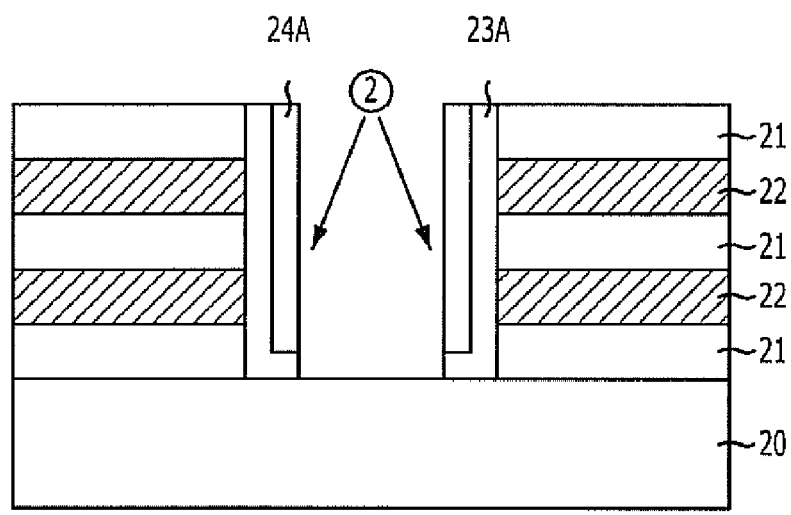
Figure 2C:
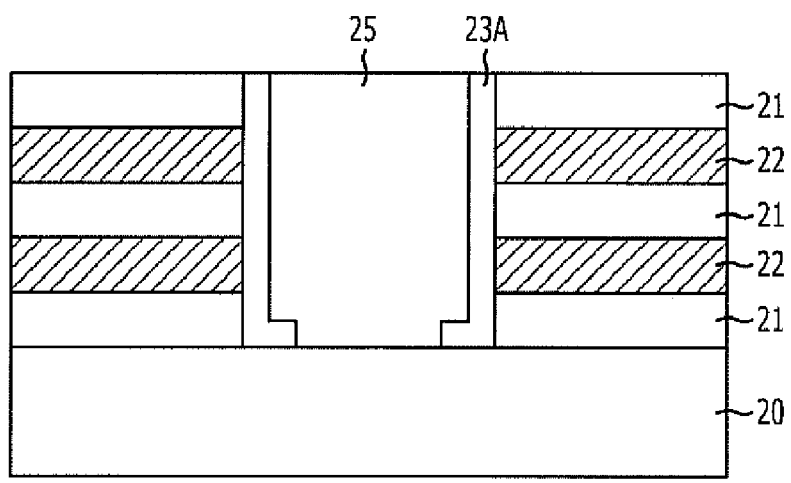

FIGS. 2A to 2C are cross-sectional views illustrating a method for fabricating a non-volatile memory device having a three-dimensional structure in accordance with a first embodiment of the present invention. Specifically, FIGS. 2A to 2C illustrate a method for fabricating a plurality of memory cells stacked on a substrate. For convenience, FIGS. 2A to 2C focus on a process of forming a plurality of memory cells.

Referring to FIG. 2A, a plurality of interlayer dielectric layers 21 and a plurality of conductive layers 22 for the purpose of forming gate electrodes are alternately formed on a substrate 20 in which a required lower structure, such as a source line and a lower select transistor, is formed.

The interlayer dielectric layers 21 separate the plurality of memory cells, and may include an oxide layer. The conductive layers 22 formed for the purpose of forming gate electrodes may include a polysilicon layer doped with a P-type impurity or an N-type impurity.

In addition, the interlayer dielectric layers 21 and the conductive layers 22 may be repetitively formed according to the number of memory cells to be stacked on the substrate 20. In this embodiment, the case in which two memory cells are stacked is illustrated for convenience.

The interlayer dielectric layers 21 and the conductive layers 22 are selectively etched to form a trench which exposes the surface of the substrate 20.

A first material layer 23 is formed over the resulting structure in which the trench is formed. The first material layer 23 serves to store data, and may include a charge blocking layer, a charge trap layer or a charge storage layer, and a tunnel insulation layer.

The charge blocking layer serves to block electric charges from passing through the charge trap layer and moving in a direction of a gate electrode. The charge blocking layer may include an oxide layer, an oxide/nitride/oxide layer, or a material layer having a high dielectric constant, for example, $Al_2O_3$, $HfO_x$, or $ZrO_x$ (where x is a natural number). The charge trap layer is used as an actual data storage layer. Where a charge storage layer stores electric charges within a conduction band, the charge storage layer may include a polysilicon layer. Alternatively, where a charge trap layer traps electric charges into deep-level trap sites, the charge trap layer may include a nitride layer. The tunnel insulation layer is provided as an energy barrier layer according to a tunneling of electric charges, and may include an oxide layer.

A second material layer 24, which prevents damage of the first material layer 23, is formed over the resulting structure in which the first material layer 23 is formed. The second material layer 24 may be formed of a material having a high etch selectivity with respect to the first material layer 23. Specifically, when the first material layer 23 includes a charge blocking layer, a charge trap layer, and a tunnel insulation layer, the second material layer 24 may be formed of a material having a high etch selectivity with respect to the tunnel insulation layer exposed to the second material layer 24. The second material layer 24 may include a nitride layer or a carbon layer having a thickness ranging from approximately 1 nm to approximately 100 nm.

The second material layer 24 formed on the first material layer 23 may prevent the first material layer 23 from being exposed in a subsequent process. That is, the second material layer 24 serves as a passivation layer which protects the first material layer 23.

Referring to FIG. 2B, portions of the second material layer 24 and the first material layer 23 formed on the bottom of the trench are removed to expose the surface of the substrate 20. In FIG. 2B, reference numeral "24A" represents the partially etched second material layer, and reference numeral "23A" represents the partially etched first material layer.

The removing of portions of the second material layer 24 and the first material layer 23 formed on the bottom of the trench may be performed by an etch-back process or a spacer etching process.

At this time, the first material layer 23A formed on the inner walls of the trench is protected by the second material layer 24A during the process of removing portions of the second material layer 24 and the first material layer 23 formed on the bottom of the trench.

That is, since the first material layer 23A formed on the inner walls of the trench is not exposed, damage to the first material layer 23A may be prevented (see ② of FIG. 2B).

Referring to FIG. 2C, the second material layer 24A remaining within the trench is removed. The trench in which the second material layer 24A is removed is filled with a channel layer 25 in order to form a channel. The channel layer 25 may include a single crystalline silicon layer or a polysilicon layer. In this way, a plurality of memory cells, including the channel, the tunnel insulation layer, the charge trap layer, the charge blocking layer, and the gate electrode are stacked on the substrate 20.

Although not illustrated, an upper select transistor, a word line, and a bit line are additionally formed in the fabrication of a non-volatile memory device having a three-dimensional structure.

As described above, the formation of the second material layer 24 on the first material layer 23 may prevent damage of the first material layer 23 during the process of forming the memory cells. In particular, the data retention characteristic and cycling characteristic of the non-volatile memory device depend on the layer quality of the charge blocking layer, the charge trap layer, and the tunnel insulation layer included in the first material layer 23. As such, since the damage of the first material layer 23 is prevented, the layer quality of the charge blocking layer, the charge trap layer, and the tunnel insulation layer may be improved, thereby increasing the reliability of the non-volatile memory device.

Figure 3A:
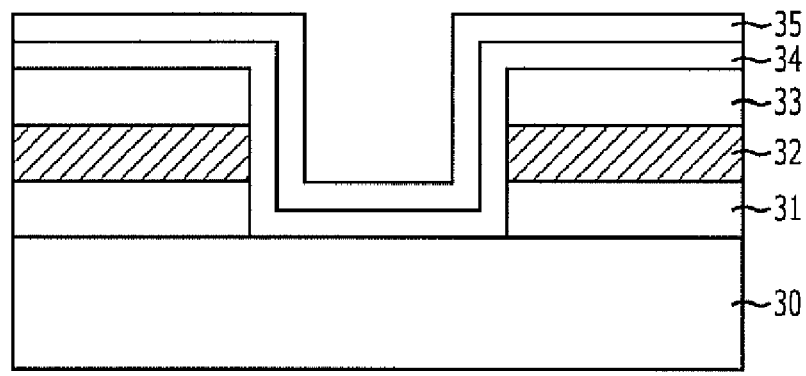
FIGS. 3A to 3C are cross-sectional views illustrating a method for fabricating a non-volatile memory device having a three-dimensional structure in accordance with a second embodiment of the present invention.
Figure 3B:
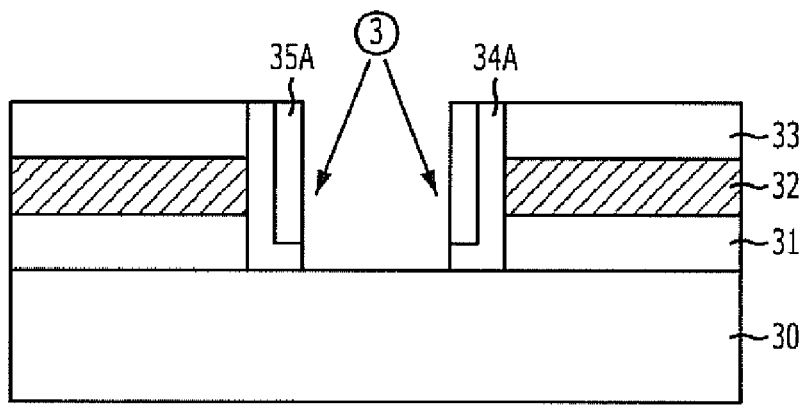
Figure 3C:
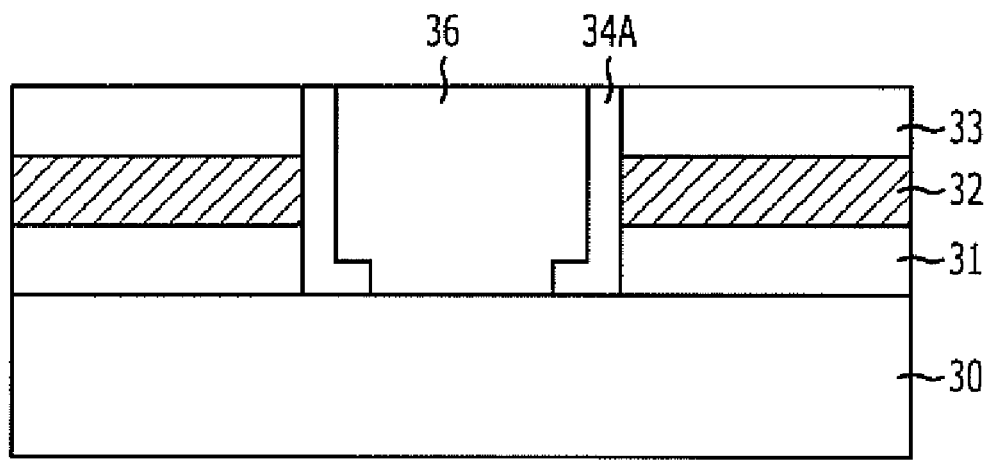

FIGS. 3A to 3C are cross-sectional views illustrating a method for fabricating a non-volatile memory device having a three-dimensional structure in accordance with a second embodiment of the present invention. Specifically, a process of forming a lower select transistor of a cell string arranged vertically on a substrate will be described as the second embodiment.

Although directed to a process of forming a lower select transistor, this embodiment is equally applied to a process of forming an upper select transistor. Moreover, this embodiment may be equally applied to a process of forming a drain select transistor, as well as a process of forming a source select transistor.

Referring to FIG. 3A, a first interlayer dielectric layer 31, a conductive layer 32 for the purpose of forming a gate electrode and a second interlayer dielectric layer 33 are formed on a substrate 30 in which a required lower structure, such as a source line, is formed.

The first interlayer dielectric layer 31 and the second interlayer dielectric layer 33 may include an oxide layer. The conductive layer 32 may include a polysilicon layer doped with a P-type impurity or an N-type impurity.

In addition, the second interlayer dielectric layer 33, the conductive layer 32, and the first interlayer dielectric layer 31 are selectively etched to form a trench which exposes the surface of the substrate 30.

A first material layer 34 is formed over the resulting structure in which the trench is formed. The first material layer 34 may be a gate dielectric layer. For example, the first material layer 34 may include an oxide layer.

The second material layer 35, which prevents damage of the first material layer 34, is formed over the resulting structure in which the first material layer 34 is formed. The second material layer 35 may be formed of a material having a high etch selectivity with respect to the first material layer 34. In particular, when the first material layer 34 is a gate dielectric layer formed of oxide, the second material layer 35 may be a nitride layer or a carbon layer. Furthermore, the second material layer 35 may be formed to a thickness ranging from approximately 1 nm to approximately 100 nm.

Referring to FIG. 3B, portions of the second material layer 35 and the first material layer 34 formed on the bottom of the trench are removed to expose the surface of the substrate 30. In FIG. 3B, reference numeral "35A" represents the partially etched second material layer, and reference numeral "34A" represents the partially etched first material layer.

The removing of portions of the second material layer 35 and the first material layer 34 formed on the bottom of the trench may be performed by an etch-back process or a spacer etching process. At this time, since the first material layer 34A formed on the inner walls of the trench is protected by the second material layer 35A, damage to the first material layer 34A may be prevented (see ③ of FIG. 3B).

Referring to FIG. 3C, the second material layer 35A remaining within the trench is removed. The trench in which the second material layer 35A is removed is filled with a channel layer 36 in order to form a channel. In this way, a lower select transistor including the channel, the gate dielectric layer, and the gate electrode is formed.

Although not illustrated, a plurality of memory cells may be stacked on the lower select transistor, and an upper select transistor may be formed on the plurality of memory cells. A non-volatile memory device having a three-dimensional structure is fabricated by performing a process of forming a word line and a bit line.

As described above, the formation of the second material layer 35 on the first material layer 34 may prevent damage of the first material layer 34 during the process of forming the lower select transistor. That is, by preventing damage of the gate dielectric layer, a variation in the threshold voltage of the transistor may be prevented and it is possible to prevent a leakage current from being generated in an off state. In particular, since the generation of the leakage current may be prevented, the boosting level may be maintained at a high level in a program inhibited cell string, thereby preventing the occurrence of error in the program operation.

FIGS. 4A to 4D are cross-sectional views illustrating a method for fabricating a vertical channel type non-volatile memory device in accordance with a third embodiment of the present invention. Specifically, the third embodiment focuses on a process of forming a plurality of memory cells stacked along a channel which protrudes vertically from a substrate.

Figure 4A:
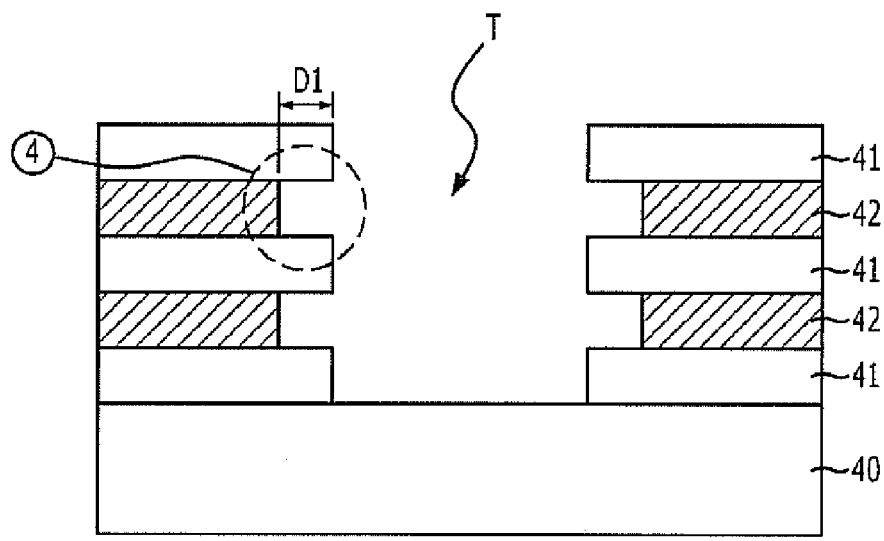
FIGS. 4A to 4E are cross-sectional views illustrating a method for fabricating a vertical channel type non-volatile memory device in accordance with a third embodiment of the present invention.

Referring to FIG. 4A, a plurality of interlayer dielectric layers 41 and a plurality of conductive layers 42 are alternately stacked on a substrate 40 in which a required lower structure, such as a source line and a lower select transistor, is formed.

The interlayer dielectric layers 41 separate the plurality of memory cells, and may include an oxide layer or a nitride layer. The conductive layers 42 may include a polysilicon layer doped with a P-type impurity or an N-type impurity.

In addition, the interlayer dielectric layers 41 and the conductive layers 42 may be repetitively formed according to the number of memory cells to be stacked on the substrate 40. In this embodiment, the case in which two memory cells are stacked is illustrated for convenience.

The interlayer dielectric layers 41 and the conductive layers 42 are selectively etched to form a trench T which exposes the surface of the substrate 40. Although the single trench T is illustrated for convenience, a plurality of trenches T may be arranged in a first direction and a second direction intersecting with the first direction. The interval between the adjacent trenches T may be determined considering the thicknesses of a charge blocking layer, a charge trap layer or a charge storage layer, and a tunnel insulation layer which are formed in a subsequent process. Furthermore, the trench T may be formed in various shapes, such as, for example, a cylindrical shape or a rectangular pillar shape.

The conductive layers 42 exposed by the inner walls of the trench T are etched by a predetermined thickness D1. As such, grooves (see ④ of FIG. 4A), recessed by the predetermined thickness D1 from the exposed surfaces of the conductive layers 42, are formed by etching the conductive layers 42 by the predetermined thickness D1 from their exposed surfaces.

Figure 4B:
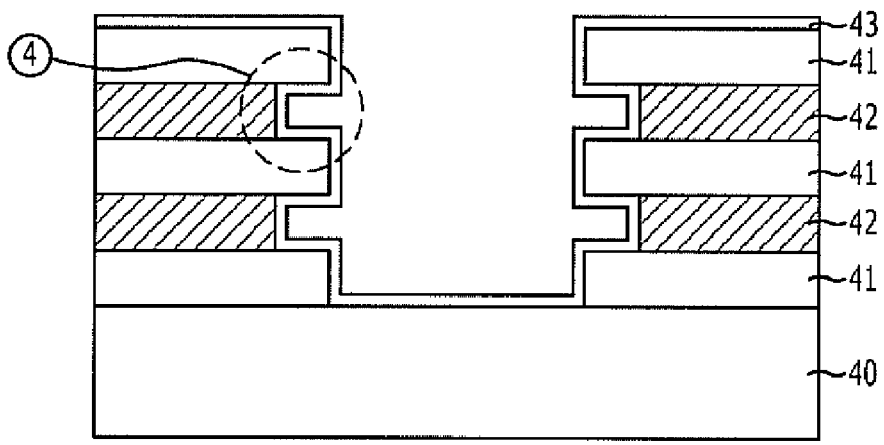

Referring to FIG. 4B, a first material layer 43 is formed over the resulting structure in which the conductive layers 42 are etched by the predetermined thickness D1. The first material layer 43 includes a charge blocking layer, a charge trap layer or a charge storage layer, and a tunnel insulation layer which are sequentially stacked.

The charge trap layer or the charge storage layer (charge trap layer/charge storage layer) is used as an actual data storage. The charge storage layer storing electric charges within a conduction band or the charge trap layer trapping electric charges into deep level trap sites may be formed. That is, the charge trap layer or the charge storage layer may be provided between the charge blocking layer and the tunnel insulation layer. For example, the charge storage layer may include a polysilicon layer, and the charge trap layer may include a nitride layer.

Since the first material layer 43 is formed along the resulting structure in which the conductive layers 42 are etched by the predetermined thickness D1, the first material layer 43 is buried within the regions in which the conductive layers 42 are etched by the predetermined thickness D1. (see ④ of FIG. 4B). In other words, the first material layer 43 is also formed in the grooves.

Figure 4C:
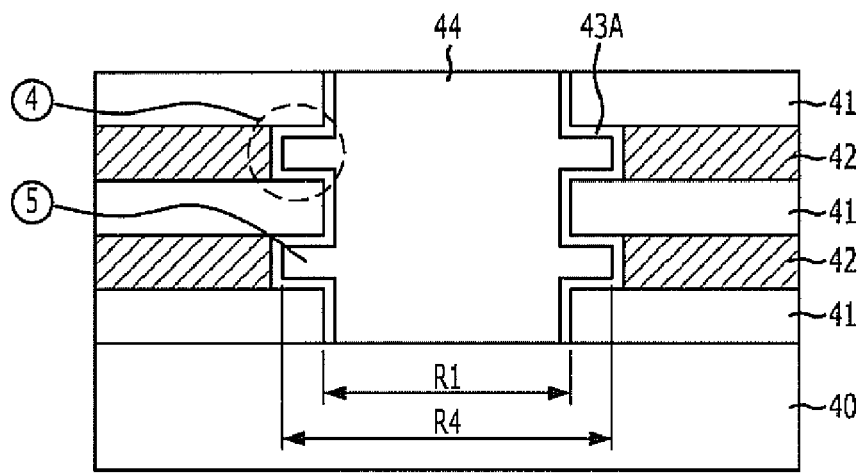

Referring to FIG. 4C, portions of the first material layer 43 formed on the bottom of the trench is removed to expose the surface of the substrate 40 corresponding to the bottom of the trench. In FIG. 4C, reference numeral "43A" represents the first material layer which remains without being etched.

The surface of the substrate 40 is exposed by etching the first material layer 43 formed on the bottom of the trench while leaving the first material layer 43 buried within the regions in which the conductive layers 42 are etched by the predetermined thickness D1 (i.e., the grooves). The first material layer 43A formed on the inner walls of the trench, except for portions of the first material layer 43A formed in the grooves, may be removed during the removing process. In this case, portions of the first material layer 43A buried within the grooves remain. The case in which only the first material layer 43 formed on the bottom of the trench is removed is illustrated in FIG. 4C.

The removing of portions of the first material layer 43 may be performed by an etch-back process or a spacer etching process. At this time, since the first material layer 43A buried within the grooves is recessed from the inner walls of the trench by a predetermined thickness D1, damage during the etching process may be minimized. Therefore, damage of the tunnel insulation layer that is exposed to the surface may be prevented. Hence, the data retention characteristic and cycling characteristic of the non-volatile memory device may be improved.

A channel 44 protruding from the substrate 40 is formed by burying a channel layer within the trench through which the surface of the substrate 40 is exposed. In this way, at least one memory cell including the channel 44, the first material layer 43A, and a gate electrode 42 is formed.

At this time, the channel layer is buried in an empty space within the grooves (see ④ of FIG. 4C). Accordingly, protrusions (see ⑤ of FIG. 4C) are formed emanating from the sidewall of the channel 44.

Moreover, the protrusions (see ⑤ of FIG. 4C) are arranged at a predetermined interval. More specifically, the channel 44 may be a pillar having a diameter of a first width R1 with protrusions (see ⑤ of FIG. 4C) which emanate from the channel's sidewalls so that for some portion the channel 44 has a second width R2 greater than the first width R1.

In addition, the charge blocking layer, the charge trap layer/the charge storage layer, and the tunnel insulation layer of the plurality of memory cells stacked along the channel 44 surround the protrusions (see ⑤ of FIG. 4C) of the channel 44.

Figure 4D:
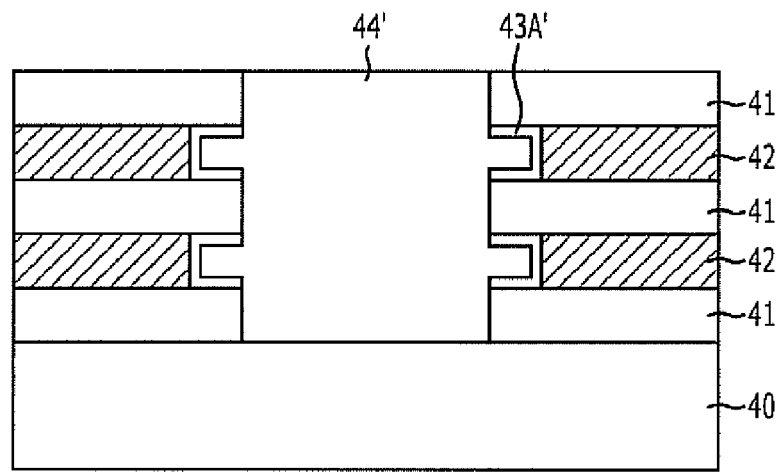

Meanwhile, FIG. 4D illustrates a case in which the first material layer 43 formed on the inner walls and the bottom of the trench, except for portions of the first material layer 43 formed in the grooves, is removed, and then the channel layer is buried to form the channel 44'.

FIG. 4D shows the resultant structure when the first material layer 43 is etched leaving only portions of the first material layer 43 that are buried in the grooves. In FIG. 4D, reference numeral "43A'" represents the remaining portions of the first material layer 43, including the charge blocking layer, the charge trap layer/the charge storage layer, and the tunnel insulation layer, that are buried within the grooves and left, and the charge blocking layer, the charge trap layer/the charge storage layer, and the tunnel insulation layer 43 formed at the inner wall of the trench outside the grooves are removed, the width of the trench is not reduced, by the charge blocking layer, the charge trap layer/the charge storage layer, and the tunnel insulation layer 43A', as compared to the prior art. Hence, the generation of the void during the burying of the channel layer 44' may be substantially prevented.

Furthermore, since the first material layer 43A' of the plurality of memory cells stacked along the channel 44' is formed to surround the protrusions, the charge trap layers/the charge storage layers of the plurality of memory cells are separated from one another. Therefore, since the charge trap layers/the charge storage layers between the adjacent gates are separated, loss of electric charges may be reduced and the data retention characteristic and the cycling characteristic of the non-volatile memory device may be further improved.

Figure 4E:
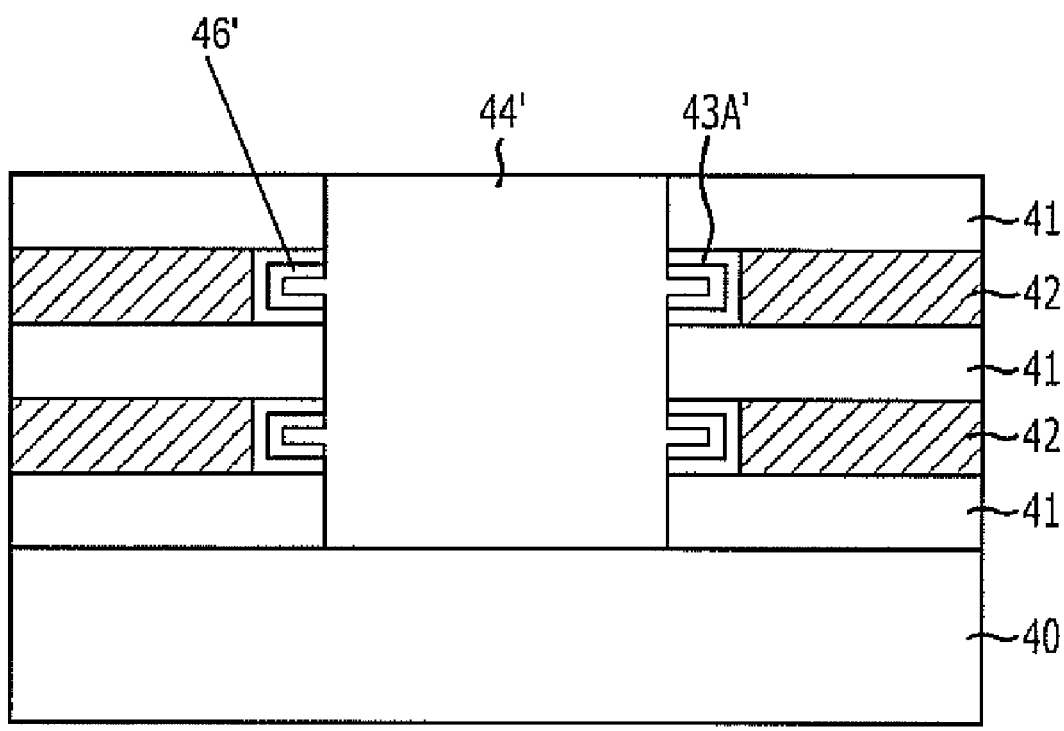

Also, FIG. 4E illustrates a case in which a passivation layer 46' formed over the tunnel insulation layer formed along the entire surface of the channel 44' having the protrusions in FIG. 4D.

The passivation layer 46', which prevents damage of the first material layer 43A', is formed along the entire surface of the channel 44' having the protrusions.

The passivation layer 46' may be formed of a material having a high etch selectivity with respect to the tunnel insulation layer. The passivation layer 46' may include any one of a nitride layer and a carbon.

FIGS. 5A to 5D are cross-sectional views illustrating a method for fabricating a vertical channel type non-volatile memory device in accordance with a fourth embodiment of the present invention. Specifically, the fourth embodiment focuses on a process of forming a plurality of memory cells stacked along a channel which protrudes vertically from a substrate. Parts of the description overlapping the description of the third embodiment will be omitted.

Figure 5A:
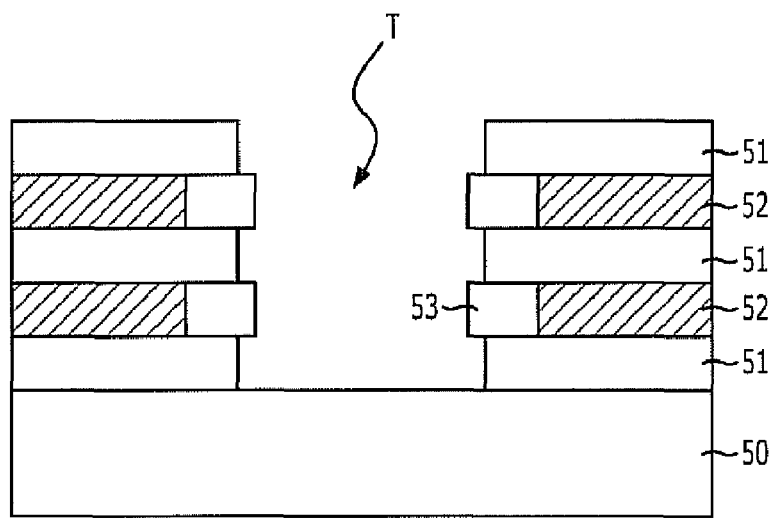
FIGS. 5A to 5D are cross-sectional views illustrating a method for fabricating a vertical channel type non-volatile memory device in accordance with a fourth embodiment of the present invention.

Referring to FIG. 5A, a plurality of interlayer dielectric layers 51 and a plurality of conductive layers 52 are alternately stacked on a substrate 50 in which a required lower structure, such as a source line and a lower select transistor, is formed. The interlayer dielectric layers 51 may include a nitride layer.

The interlayer dielectric layers 51 and the conductive layers 52 are etched to form a trench which exposes the surface of the substrate 50.

The conductive layers 52 exposed by the inner walls of the trench T are oxidized to a predetermined thickness from the surface by an oxidation process. At this time, the surfaces of the conductive layers 52 are oxidized to a predetermined thickness by an oxidation process thereby forming oxide layers 53.

Figure 5B:
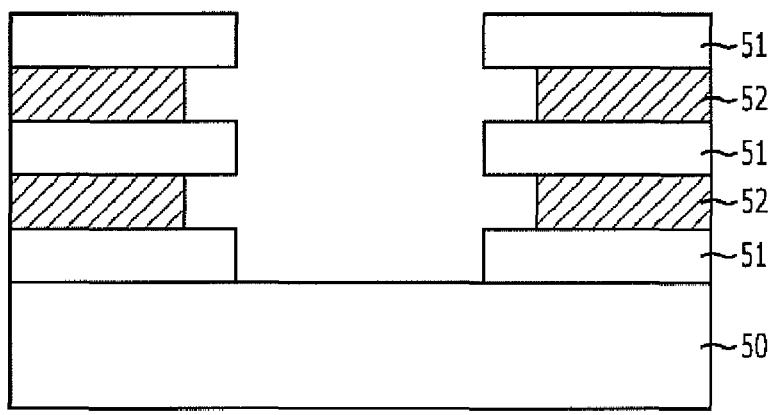

Referring to FIG. 5B, the oxide layer 53 formed by oxidizing the conductive layers 52 is removed. The process of removing the oxide layer 53 may be performed where the oxide layer 53 has a high etch selectivity with respect to the interlayer dielectric layer 51. For example, the process of removing the oxide layer 53 may be performed where the oxide layer has a high etch selectivity with respect to the nitride layer.

In addition, the process of removing the oxide layer 53 may be performed by a wet etching process. The conductive layers 52 may be etched to a predetermined thickness by various processes except for the wet etching process. For example, the conductive layers 52 may be etched to a predetermined thickness by an isotropic etching process.

Figure 5C:
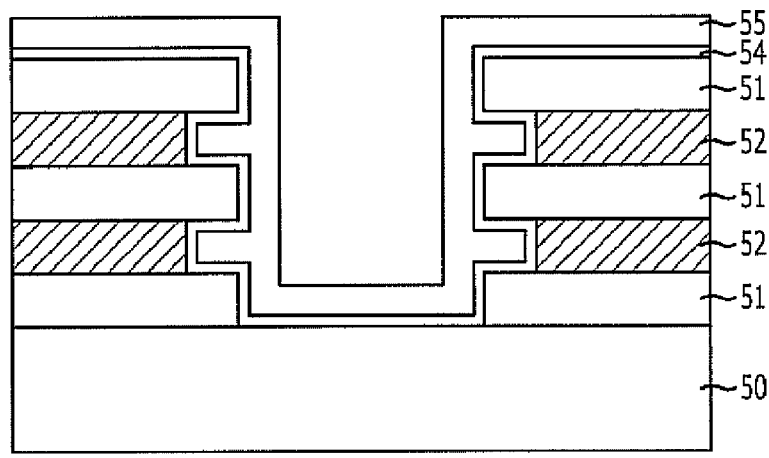

Referring to FIG. 5C, a first material layer 54 and a second material layer 55 which prevents damage of the first material layer 54 are formed over the resulting structure in which the conductive layers 52 are etched to a predetermined thickness. At this time, the first material layer 54 and the second material layer 55 are sequentially buried within regions in which the conductive layers 52 are etched by a predetermined thickness.

The first material layer 54 serves as a layer for data storage and may include a charge blocking layer, a charge trap layer/a charge storage layer, and a tunnel insulation layer.

The second material layer 55 may be formed of a material having a high etch selectivity with respect to the first material layer 54. Specifically, when the first material layer 54 includes a charge blocking layer, a charge trap layer/a charge storage layer, and a tunnel insulation layer, the second material layer 55 may be formed of a material having a high etch selectivity with respect to the tunnel insulation layer exposed to the first material layer 54. The second material layer 55 may include a nitride layer, a carbon layer, or a polysilicon layer.

The formation of the second material layer 55 on the first material layer 54 prevents the first material layer 54 from being exposed during a subsequent removing process. That is, the second material layer 55 serves as a passivation layer which protects the first material layer 54.

Figure 5D:
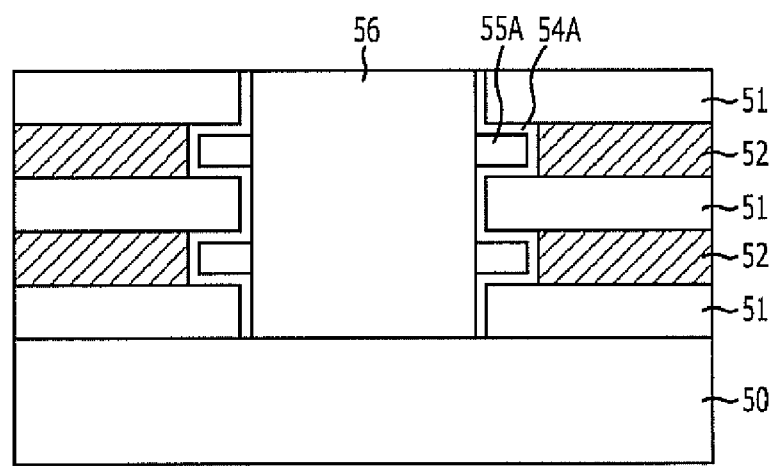

Referring to FIG. 5D, portions of the second material layer 55 and the first material layer 54 formed on the bottom of the trench are removed to expose the surface of the substrate 50. In FIG. 5D, reference numeral "54A" represents the first material layer which remains without being etched, and reference numeral "55A" represents the second material layer which remains without being etched.

The surface of the substrate 50 is exposed by etching portions of the second material layer 55 and the first material layer 54 formed on the bottom of the trench, while leaving the first material layer 54A and the second material layer 55A buried in the region in which the conductive layers 52 are etched to a predetermined thickness.

In such an etching process, the first material layer 54A is buried within the region in which the conductive layers 52 are etched to a predetermined thickness, and is also protected by the second material layer 55A. That is, damage of the first material layer 54A may be minimized by preventing the first material layer 54A from being exposed during the etching process.

As described above, the second material layer 55 and the first material layer 54 formed on the inner walls of the trench, except for portions of the second material layer 55 and the first material layer 54 buried in the grooves, may be removed together. In this case, only the second material layer 55A and the first material layer 54A buried within the grooves remain.

The second material layer 55A remaining within the trench may be removed according to a physical property of the second material layer 55A. For example, when the second material layer 55A and the channel layer, for forming a channel in a subsequent process, are formed of a material having a substantially similar physical property, the second material layer 55A may not be removed. The substantially similar physical property refers to similar physical characteristics. Therefore, when the second material layer 55A is formed of a material having a physical property which can serve as a "channel" like the channel layer, the second material layer 55A is not removed. On the other hand, when the second material layer 55A and the channel layer are formed of materials having different physical properties, the second material layer 55A may be removed. That is, the second material layer 55A may be formed of a material having a physical property which prevents the second material layer 55A from serving as a "channel" in which case the second material layer 55A may be removed.

As described above, when the second material layer 55A includes a nitride layer or a carbon layer, the second material layer 55A may be removed before the channel layer is buried. When the second material layer 55A includes the polysilicon layer, the second material layer 55A may not be removed.

A channel 56 which protrudes from the substrate 50 is formed by burying a channel layer within the trench through which the surface of the substrate 50 is exposed. In this way, the memory cell including the channel 56, the first material layer 54A, and the gate electrode 52 is formed.

The passivation layer may be formed over the tunnel insulation layer formed along the entire surface of the channel having the protrusions when the passivation layer includes a polysilicon layer As described above, when the second material layer 55A includes the polysilicon layer, the remaining second material layer 55A is not removed and serves as a channel. When the second material layer 55A includes the nitride layer or the carbon layer, the layer for a channel is buried in the region in which the second material layer 55A is removed.

Figure 6A:
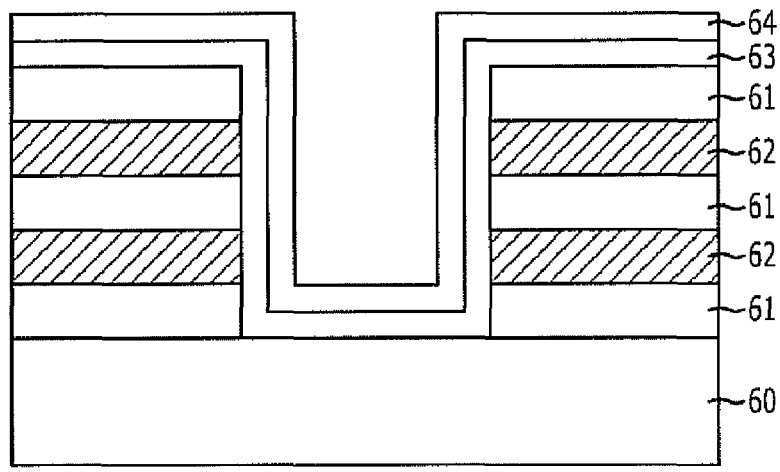
FIGS. 6A to 6C are cross-sectional views illustrating a method for fabricating a vertical channel type non-volatile memory device in accordance with a fifth embodiment of the present invention.
Figure 6B:
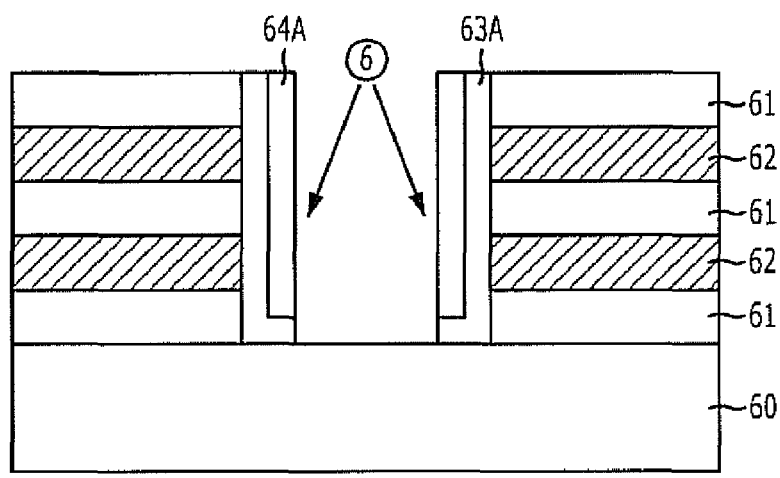
Figure 6C:
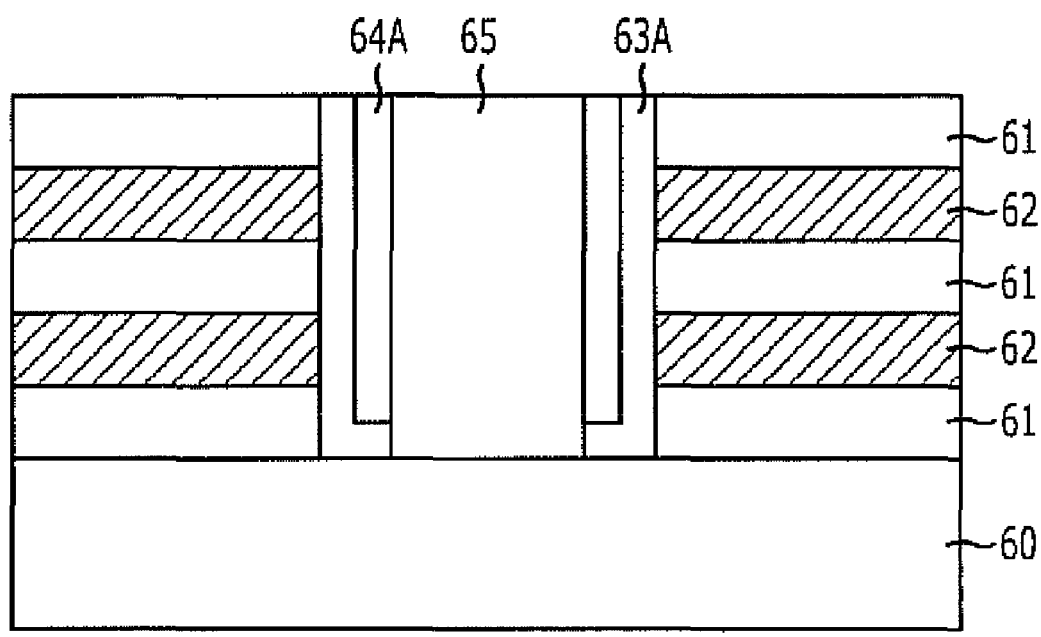

FIGS. 6A to 6C are cross-sectional views illustrating a method for fabricating a non-volatile memory device having a three-dimensional structure in accordance with a fifth embodiment of the present invention. Specifically, the fifth embodiment focuses on a process of forming a plurality of memory cells stacked along a channel which protrudes vertically from a substrate. Parts of the description overlapping the description of the third and fourth embodiments will be omitted.

Referring to FIG. 6A, a plurality of interlayer dielectric layers 61 and a plurality of conductive layers 62 are alternately stacked on a substrate 60 in which a required lower structure, such as a source line and a lower select transistor, is formed.

The interlayer dielectric layers 61 and the conductive layers 62 are selectively etched to form a trench which exposes the surface of the substrate 60.

A first material layer 63 is formed over the resulting structure in which the trench is formed. The first material layer 63 serves as a layer for data storage and may include a charge blocking layer, a charge trap layer/a charge storage layer, and a tunnel insulation layer.

A second material layer 64 is formed over the resulting structure in which the first material layer 63 is formed. The second material layer 64 is formed of a material having a substantially similar physical property as a channel layer used to subsequently form a channel. For example, the second material layer 64 may include a polysilicon layer.

The formation of the second material layer 64 on the first material layer 63 prevents the first material layer 63 from being exposed and damaged during a subsequent removing process. Furthermore, since the second material layer 64 has a substantially similar physical property as the channel layer, the second material layer 64 used as a passivation layer which protects the first material layer 63 need not be removed before the channel layer is buried.

Referring to FIG. 6B, portions of the second material layer 64 and the first material layer 63 formed on the bottom of the trench are removed to expose the surface of the substrate 60. In FIG. 6B, reference numeral "64A" represents the partially etched second material layer, and reference numeral "63A" represents the partially etched first material layer.

During the process of removing the second material layer 64 and the first material layer 63 formed on the bottom of the trench, the first material layer 63 formed on the inner walls of the trench is protected by the second material layer 64. That is, the first material layer 63 formed on the inner walls of the trench is not exposed, and thus, damage of the first material layer 63 may be prevented (see ⑥ of FIG. 6B).

Referring to FIG. 6C, a channel is formed by filling the trench with a channel layer 65 used for subsequently forming a channel.

Since the second material layer 64A and the channel layer 65 are formed of materials having substantially similar physical properties, the second material layer 64A need not be removed and the channel layer 65 is buried within the trench in which the surface of the substrate 60 is exposed and the second material layer 64A remains. Accordingly, both the remaining second material layer 64A and the channel layer 65 serve as a channel. Alternatively, it is noted that the channel layer 65 may be buried after the second material layer 64A is removed.

Since the second material layer 64A is partially damaged during the process of exposing the substrate 60 corresponding to the bottom of the trench, a curing process may be performed after the layer 65 for a channel is buried.

In this way, a plurality of memory cells which include the channel, the tunnel insulation layer, the charge trap layer/the charge storage layer, the charge blocking layer, and gate electrodes are stacked on the substrate 60.

Although the method for fabricating the non-volatile memory device has been described above, it is merely for convenience of explanation and the invention is not limited thereto. Although the vertical cell string structure in which the cell string is arranged vertically from the substrate has been described above as one example of the non-volatile memory device having the three-dimensional structure, it is merely one embodiment. The invention may also be applied to three-dimensional non-volatile memory devices having various structures, for example, non-volatile memory devices having a three-dimensional structure in which a plurality of cell strings are stacked.

Furthermore, the invention may be applied to the process of forming an upper select transistor or a lower select transistor of a non-volatile memory device. In this case, a gate dielectric layer may be formed instead of the charge blocking layer, the charge trap layer/the charge storage layer, and the tunnel insulation layer. In the fourth and fifth embodiments, the first material layer may be a gate dielectric layer. Accordingly, damage to the gate dielectric layer may be prevented. Thus, variation in the threshold voltage of the transistor may be prevented, and it is possible to prevent a leakage current from being generated in an off state. In particular, since the generation of the leakage current is prevented, the boosting level is maintained at a high level in the program inhibited string, thereby preventing the occurrence of an error in the program operation.

In accordance with the exemplary embodiments of the present invention, the damage of the tunnel insulation layer during the etch-back process may be prevented by forming the passivation layer on the charge blocking layer, the charge trap layer or the charge storage layer, and the tunnel insulation layer. Therefore, the data retention characteristic and the cycling characteristic may be improved, and the reliability of the non-volatile memory device may be improved.

Furthermore, damage to the tunnel insulation layer during the etch-back process may be prevented by forming the charge blocking layer, the charge trap layer or the charge storage layer, and the tunnel insulation layer after gate electrodes exposed by the inner walls of the trench used to form a channel are etched to a predetermined thickness. Therefore, the reliability of the non-volatile memory device may be improved.

Moreover, it is possible to prevent the gate dielectric layer of the select transistor from being damaged during the fabrication process of the non-volatile memory device. Thus, it is possible to prevent variation of the threshold voltage of the select transistor, and it is possible to prevent a leakage current from being generated in an off state. In particular, since the generation of the leakage current is prevented, it is possible to prevent the boosting level from being lowered in the program inhibited cell string, thereby minimizing the occurrence of an error in the program operation.

While the present invention has been described with respect to specific embodiments, it will be apparent to those skilled in the art that various changes and modifications may be made without departing from the spirit and scope of the invention as defined in the following claims.

What is claimed is:

1. A method for fabricating a non-volatile memory device, the method comprising:
   alternately stacking a plurality of interlayer dielectric layers and a plurality of conductive layers over a substrate;
   etching the interlayer dielectric layers and the conductive layers to form a trench which exposes a surface of the substrate;
   forming a first material layer over an entire surface of a resulting structure in which the trench is formed;
   forming a second material layer over the first material layer;
   removing portions of the second material layer and the first material layer formed on a bottom of the trench to expose the surface of the substrate;
   removing remaining portions of the second material layer; and
   filling the trench with a channel layer in which the remaining portions of the second material layer are removed.

2. The method of claim 1, wherein the first material layer comprises a charge blocking layer, a charge trap layer or a charge storage layer, and a tunnel insulation layer.

3. The method of claim 1, wherein the first material layer serves as a gate dielectric layer of a select transistor.

4. The method of claim 1, wherein the second material layer is formed of a material having a high etch selectivity with respect to the first material layer.

5. The method of claim 4, wherein the second material layer comprises a nitride layer or a carbon layer.

6. The method of claim 4, wherein the second material layer comprises a polysilicon layer.

7. The method of claim 1, wherein the second material layer has a thickness ranging from approximately 1 nm to approximately 100 nm.

8. A method for fabricating a non-volatile memory device, the method comprising:
- alternately stacking a plurality of interlayer dielectric layers and a plurality of conductive layers over a substrate;
- etching the interlayer dielectric layers and the conductive layers to form a trench;
- etching the conductive layers exposed by inner walls of the trench by a predetermined thickness to form grooves in the trench;
- forming a charge blocking layer, a charge trap layer or a charge storage layer, and a tunnel insulation layer along an entire surface of the trench, including surfaces of the conductive layers exposed by the grooves, wherein the tunnel insulation layer, the charge trap layer or the charge storage layer, and the charge blocking layer are buried in the grooves;
- removing portions of the tunnel insulation layer, the charge trap layer or the charge storage layer, and the charge blocking layer formed on a bottom of the trench; and
- filling the trench with a channel material.

9. The method of claim 8, further comprising:
- removing the tunnel insulation layer, the charge trap layer or the charge storage layer, and the charge blocking layer formed on the inner walls of the trench from surfaces of the interlayer dielectric layers, so that the tunnel insulation layer, the charge trap layer or the charge storage layer, and the charge blocking layer remain only within the grooves.

10. The method of claim 8, wherein the etching of the conductive layers by a predetermined thickness to form grooves comprises:
- performing an oxidation process to oxidize the conductive layers exposed by the inner walls of the trench to form an oxide layer of a predetermined thickness; and
- removing the oxide layer.

11. The method of claim 8, further comprising forming a passivation layer over the charge blocking layer, the charge trap layer or the charge storage layer, and the tunnel insulation layer formed along the inner walls of the trench.

12. The method of claim 11, wherein the passivation layer is formed of a material having a high etch selectivity with respect to the tunnel insulation layer.

13. The method of claim 12, wherein the passivation layer comprises any one of a nitride layer, a carbon layer, and a polysilicon layer.

14. The method of claim 13, further comprising removing the passivation layer after portions of the passivation layer, the tunnel insulation layer, the charge trap layer or the charge storage layer, and the charge blocking layer formed on the bottom of the trench are removed, when the passivation layer comprises the nitride layer or the carbon layer.

15. The method of claim 13, further comprising performing a curing process on the passivation layer after the passivation layer, the tunnel insulation layer, the charge trap layer or the charge storage layer, and the charge blocking layer formed on the bottom of the trench are removed, when the passivation layer comprises the polysilicon layer.

16. The method of claim 11, wherein, in the removing of portions of the tunnel insulation layer, the charge trap layer or the charge storage layer, and the charge blocking layer formed on the bottom of the trench, the passivation layer is removed together, and the passivation layer, the tunnel insulation layer, the charge trap layer or the charge storage layer, and the charge blocking layer formed on the bottom of the trench are etched and removed while leaving the passivation layer, the charge trap layer or the charge storage layer, the charge blocking layer, and the tunnel insulation layer within the grooves.

17. A method for fabricating a vertical channel type non-volatile memory device, the method comprising:
- alternately stacking a plurality of interlayer dielectric layers and a plurality of conductive layers over a substrate;
- etching the interlayer dielectric layers and the conductive layers to form a trench;
- forming a charge blocking layer, a charge trap layer or a charge storage layer, and a tunnel insulation layer along an entire surface of the trench;
- forming a passivation layer over the charge blocking layer, the charge trap layer or the charge storage layer, and the tunnel insulation layer formed along the entire surface of the trench; and
- removing portions of the passivation layer, the tunnel insulation layer, the charge trap layer or the charge storage layer, and the charge blocking layer formed on a bottom of the trench.

18. The method of claim 17, wherein the passivation layer comprises polysilicon.

19. The method of claim 17, further comprising performing a curing process on the passivation layer after the removing of portions of the passivation layer, the tunnel insulation layer, the charge trap layer or the charge storage layer, and the charge blocking layer formed on the bottom of the trench.

* * * * *